Dec. 18, 1956 F. J. BURGER 2,774,866
AUTOMATIC GAIN AND BAND WIDTH CONTROL FOR TRANSISTOR CIRCUITS
Filed Jan. 30, 1956
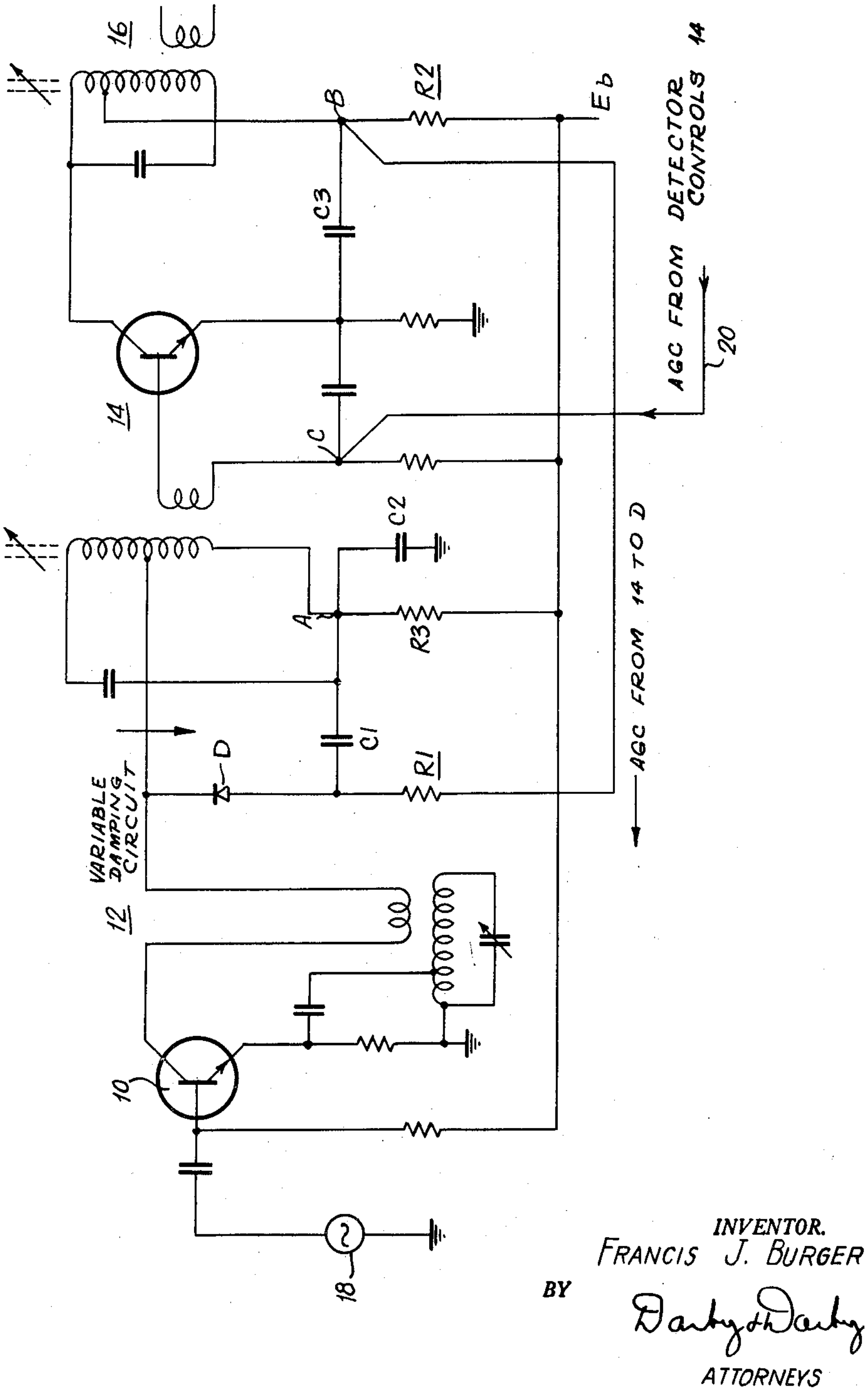
INVENTOR.
FRANCIS J. BURGER
BY Darby & Darby
ATTORNEYS United States Patent Office 2,774,866

Patented Dec. 18, 1956

2,774,866

AUTOMATIC GAIN AND BAND WIDTH CONTROL FOR TRANSISTOR CIRCUITS

Francis J. Burger, Leonia, N. J., assignor to Emerson Radio & Phonograph Corporation, Jersey City, N. J., a corporation of New York Application January 30, 1956, Serial No. 562,072

6 Claims. (Cl. 250—20)

This invention relates to improvements in transistor circuits, particularly transistor radio receivers with respect to means for providing automatic gain and band width control.

The general object of this invention is to provide an automatically controlled variable damping circuit for transistor circuits such as radio receivers by means of which the gain and band width of the main circuit is automatically controlled.

More specifically, an object of this invention is to provide a variable damping system for controlling primary damping of the converter intermediate frequency coil as a function of the automatic gain control voltage wherein the signal handling capacity of the receiver is increased, changes in the intermediate frequency band width are reduced and the shifting of the frequency center for the intermediate frequency stage is minimized.

Other and more detailed objects of the invention will be apparent from the following disclosure of the embodiment thereof illustrated in the attached drawings.

In the drawings the single figure is a diagrammatic and schematic illustration of one application of the damping system of this invention as applied to a transistor radio receiver.

The system selected for illustrating the invention includes a converter stage 12 having an input transistor 10 supplied from any suitable signal source 18 which, of course, can be an antenna system. The details of the converter stage are for the purposes of this invention to be taken as conventional and illustrative since they are capable of wide variation within the knowledge in the art.

The output of the converter stage is applied to an intermediate frequency amplifier circuit 14 through a coupling transformer in the usual manner. The output of the intermediate frequency amplifier is fed to subsequent circuit elements, which can be widely varied, through a coupling transformer 16. The connection 20 is from the detector stage, not shown, to provide an automatic gain control voltage to the point C, in accordance with established practice.

The invention itself consists in applying a suitable diode D, which may be of the semi-conductor type by way of example, in series through a capacitor C1 between a tapped point on the primary of the transformer which couples the converter 12 with the intermediate frequency amplifier 14 and the point A, that is one end of that primary. The junction point of the diode D and the capacitor C1 is connected through an isolating and filtering resistor R1 to the point B which is connected to the primary of the intermediate frequency output coupling transformer 16.

In the usual circuit of this type, without the variable damping system of this invention, when the automatic gain control voltage is applied to reduce the gain of the first intermediate frequency amplifier, distortion occurs upon the application of the input signals due to the small signal handling capacity of this amplifier stage under the reduced gain conditions. In order to prevent such distortion some means is required to reduce the signal level prior to its application to the first intermediate frequency stage. In addition to the distortion problem, as is known, the band width of the intermediate frequency amplifier varies as a function of the magnitude of the automatic gain control voltage. As the gain of the transistor is reduced, the loading which it presents to the intermediate frequency coils decreases, thus increasing the Q of the circuit and narrowing the band width. There also results a change in reactive loading provided by the I. F. transistor which causes the intermediate frequency coils to shift their frequency center to a higher value.

The purpose of this invention is to provide a variable damping system which will vary the primary damping of the converter intermediate frequency coil as a function of the automatic gain control voltage. With a suitable proportional variable damping factor system the signal handling capacity of the receiver is increased, the intermediate frequency band width change is reduced, and the shifting of the frequency center of the intermediate frequency amplifier is minimized.

These objects are accomplished through the use of the connections described above involving the diode D, capacitor C1 and resistor R1.

With this arrangement under small input signal conditions the voltages at the points A and B are but slightly different and are of such polarity that the diode D is for practical purposes open circuited and has very little damping effect on the primary of the input transformer and the intermediate frequency amplifier.

However, with large input signals the change in the automatic gain control voltage changes the base to emitter potential on the transistor 14 of the intermediate frequency amplifier, thus reducing its collector current and gain. As the collector current of the transistor 14 is thereby reduced, the voltage drop across the resistor R2 decreases, causing an increase in the voltage difference between the points A and B in such a direction as to decrease the internal impedance of the diode D. The resulting decrease in impedance of the diode D reduces the gain in the output of the converter stage and prevents the Q of the intermediate frequency coupling transformer from rising due to the unloading action of the low collector current operating point of the intermediate frequency amplifier. It follows, of course, that the shifting of the frequency center of the intermediate frequency amplifier is minimized by this change in Q and loading by the additional damping provided by the diode D.

Although the foregoing will be completely understood by those skilled in the art, this material is added as further explanation of the illustrated example of the invention herein disclosed.

The value of C1 is not critical providing it is within the limits 0.05 and approximately 1 mfd. A typical value is 0.1 mfd. Resistor R1 also is not critical in value and can be selected anywhere in the range of 500 to 5000 ohms. Obviously the larger the value of R1 the greater the decoupling effect and the more limited the current flow through the diode D becomes. As an example, however, a given differential voltage between the points A and B, if R1 is zero, maximum diode current will flow; conversely as R1 is made larger the magnitude of the diode current becomes smaller. From this it can be seen that R1 has a limiting effect upon the maximum amount of diode current that can flow. C2 and C3 are merely bypass capacitors having values between 0.01 and 0.1 mfd. as found in conventional transistor radio receiver circuits. R3 and R2 are merely B+ isolating resistors which in conjunction with their respective capacitors C2 and C3 decouple the two stages to prevent regeneration and interaction effects. The values of R2 and R3 are usually between 200 and 2000 ohms. These values are preferably kept as low as possible so as to avoid excessive battery voltage drop. In this particular application R1 is kept low in value but R2 is kept on the high side, so that for a given current change in the I. F. amplifier collector circuit there will be a sufficiently large change in voltage at the point B. It is this change in voltage which provides the required differential voltage between the points A and B for operation of the damping diode D.

Those skilled in the art will therefore appreciate by the simple expedients herein disclosed, that the defects pointed out above are eliminated or minimized, thereby improving the overall operation of the circuit by reducing distortion over a relatively wide practical input signal variation range, the band width of the intermediate frequency amplifier is maintained, as required under these conditions.

Those skilled in the art will appreciate that some variations in the details of the invention herein disclosed can be made without departure from the novel subject matter thereof. It is preferred, therefore, to be limited by the claims appended hereto rather than by the illustrative disclosure herein contained.

What is claimed is:

1. A circuit comprising a transistor frequency converter stage having a signal input circuit and an output circuit, an intermediate frequency amplifier having an input circuit and an output circuit, a transformer coupling the output circuit of the converter to the input circuit of the amplifier, an impedance in the output of said amplifier, an automatic gain control voltage connection to the input of said amplifier, and a variable damping circuit connected across the primary of said coupling transformer and to said impedance.

2. In the combination of claim 1, said impedance being an inductance.

3. In the combination of claim 1, said damping circuit comprising a diode and capacitor connected in series across the primary of said transformer and a connection from the common point of said diode and capacitor including an impedance to said first impedance.

4. In the combination of claim 1, said damping circuit comprising a diode and a capacitor connected in series across the primary of said transformer and a connection from the common point of said diode and capacitor including an isolating and filtering resistor to said impedance.

5. The combination with a transistor radio receiver comprising a converter stage, an intermediate frequency amplifying stage, a transformer for coupling said stages, and an automatic gain control voltage connection to said amplifier stage, of variable damping means connected between the primary of said transformer and the output circuit of said amplifier stage.

6. The combination with a transistor radio receiver comprising a converter stage, an intermediate frequency amplifying stage, a transformer for coupling said stages, and an automatic gain control voltage connected to said amplifier stage, of varibale damping means connected between the primary of said transformer and the output circuit of said amplifier stage consisting of a diode and capacitor in series across the portion of the primary of said transformer and an impedance connection from the common point of said diode and capacitor to the output circuit of said amplifier stage.

References Cited in the file of this patent

UNITED STATES PATENTS 2,273,639 Haantjes ---------------- Feb. 17, 1942

OTHER REFERENCES

Barton: "An Experimental Transistor Personal Broadcast Receiver," Proceedings of Inst. of Radio Engineers, July 1954, pp. 1062–1066.